(12) United States Patent
Tsubata et al.

(10) Patent No.: US 9,093,632 B2
(45) Date of Patent: Jul. 28, 2015

(54) NONVOLATILE SEMICONDUCTOR MEMORY DEVICE AND METHOD OF MANUFACTURING THE SAME

(71) Applicants: Shuichi Tsubata, Seoul (KR); Masatoshi Yoshikawa, Seoul (KR); Satoshi Seto, Seoul (KR); Kazuhiro Tomioka, Seoul (KR); Ga Young Ha, Icheon-si (KR)

(72) Inventors: Shuichi Tsubata, Seoul (KR); Masatoshi Yoshikawa, Seoul (KR); Satoshi Seto, Seoul (KR); Kazuhiro Tomioka, Seoul (KR); Ga Young Ha, Icheon-si (KR)

(*) Notice: Subject to any disclaimer, the term of this patent is extended or adjusted under 35 U.S.C. 154(b) by 0 days.

(21) Appl. No.: 14/203,422

(22) Filed: Mar. 10, 2014

(65) Prior Publication Data
US 2015/0069559 A1 Mar. 12, 2015

Related U.S. Application Data

(60) Provisional application No. 61/875,416, filed on Sep. 9, 2013.

(51) Int. Cl.
H01L 27/00 (2006.01)
H01L 43/02 (2006.01)
H01L 43/12 (2006.01)
H01L 27/22 (2006.01)
H01L 21/28 (2006.01)

(52) U.S. Cl.
CPC .......... *H01L 43/02* (2013.01); *H01L 21/28202* (2013.01); *H01L 27/222* (2013.01); *H01L 43/12* (2013.01)

(58) Field of Classification Search
CPC ................ H01L 21/28202; H01L 27/222
See application file for complete search history.

(56) References Cited

U.S. PATENT DOCUMENTS

| 8,081,505 | B2 | 12/2011 | Kajiyama et al. | |
| 8,339,841 | B2 | 12/2012 | Iwayama | |
| 2001/0031383 | A1* | 10/2001 | Sakawaki et al. | 428/694 TS |
| 2004/0101702 | A1* | 5/2004 | Kim et al. | 428/492 |

FOREIGN PATENT DOCUMENTS

JP 2008-141210 A 6/2008

* cited by examiner

*Primary Examiner* — Ngan Ngo
(74) *Attorney, Agent, or Firm* — Holtz, Holtz, Goodman & Chick PC

(57) ABSTRACT

According to one embodiment, a nonvolatile semiconductor memory device includes a magnetoresistive element formed on a semiconductor substrate, a first contact plug which extends through an interlayer dielectric film formed on the semiconductor substrate and immediately below the magnetoresistive element, has a bottom surface in contact with an upper surface of the semiconductor substrate, and is adjacent to the magnetoresistive element, and an insulating film formed between the magnetoresistive element and the first contact plug and on the interlayer dielectric film, wherein the insulating film includes a first region positioned on a side of the interlayer dielectric film, and a second region positioned in the insulating film and on an upper surface of the first region, the insulating film is made of SiN, and the first region is a nitrogen rich film compared to the second region.

9 Claims, 7 Drawing Sheets

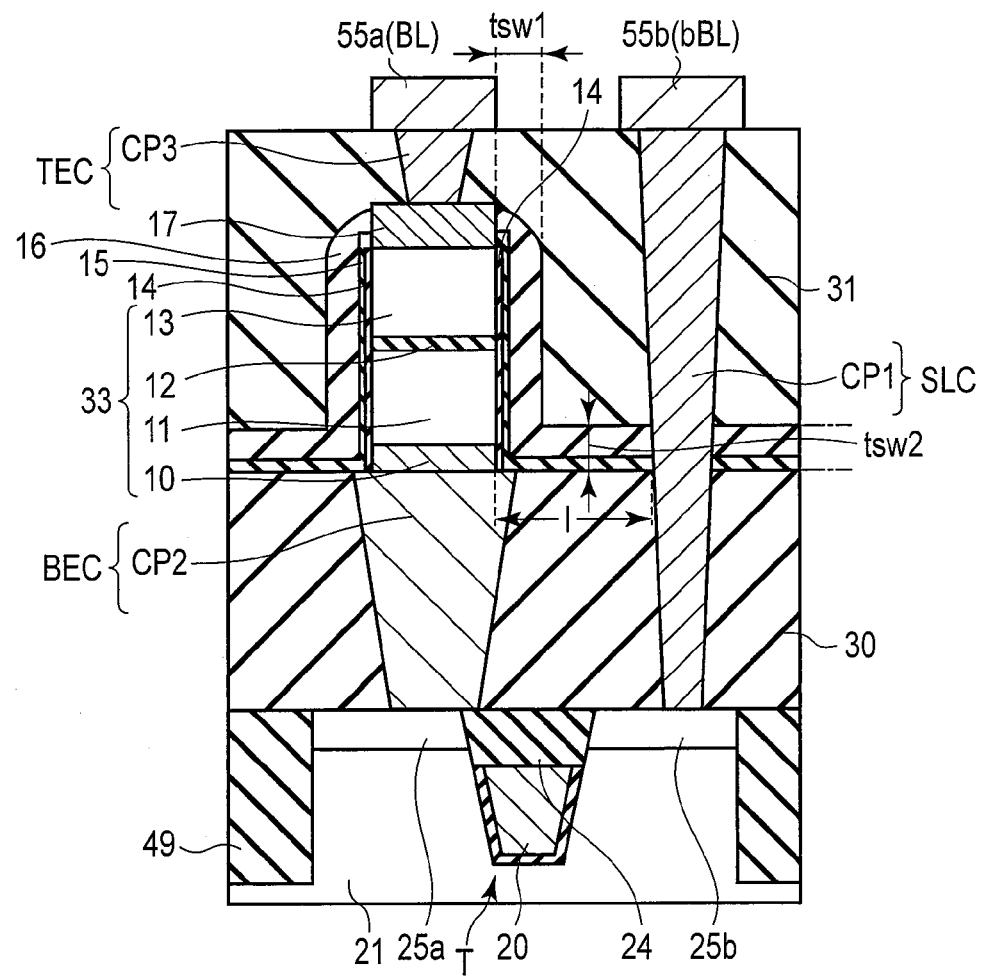
F I G. 3

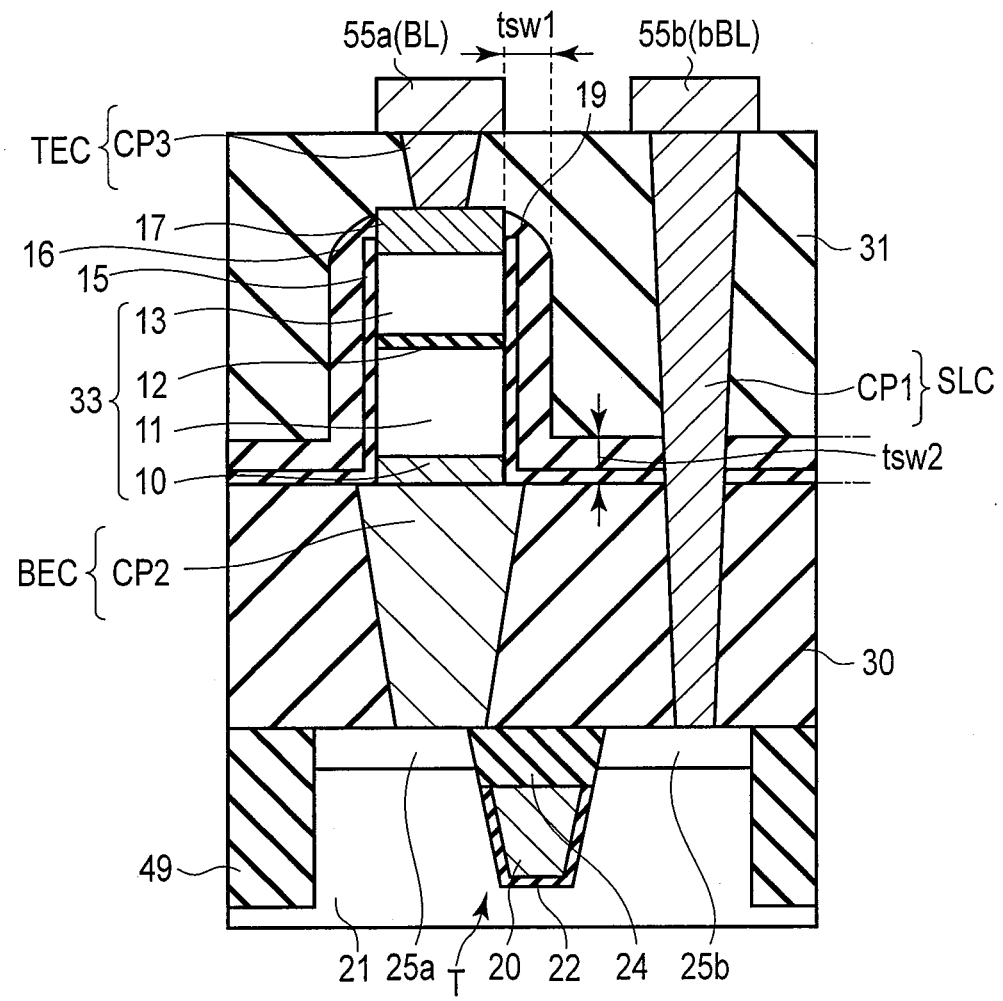
F I G. 8

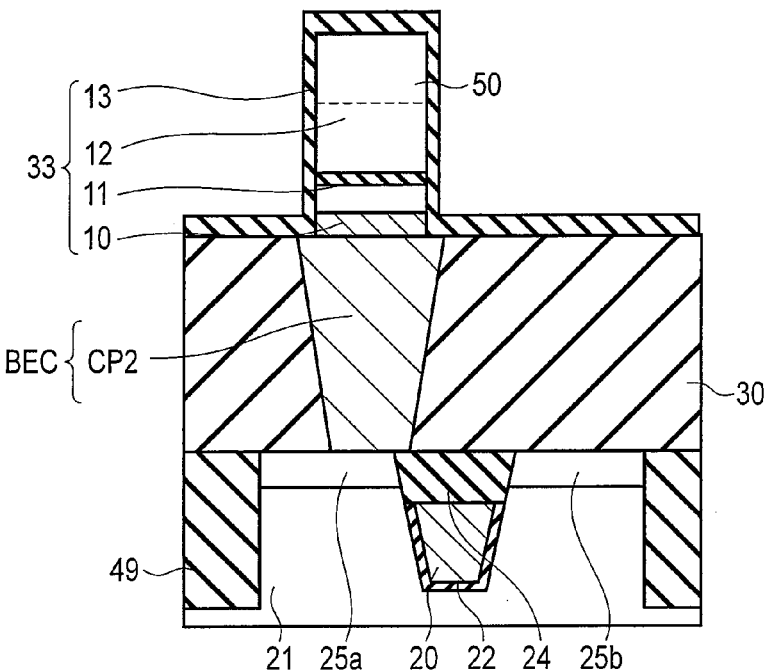
F I G. 9
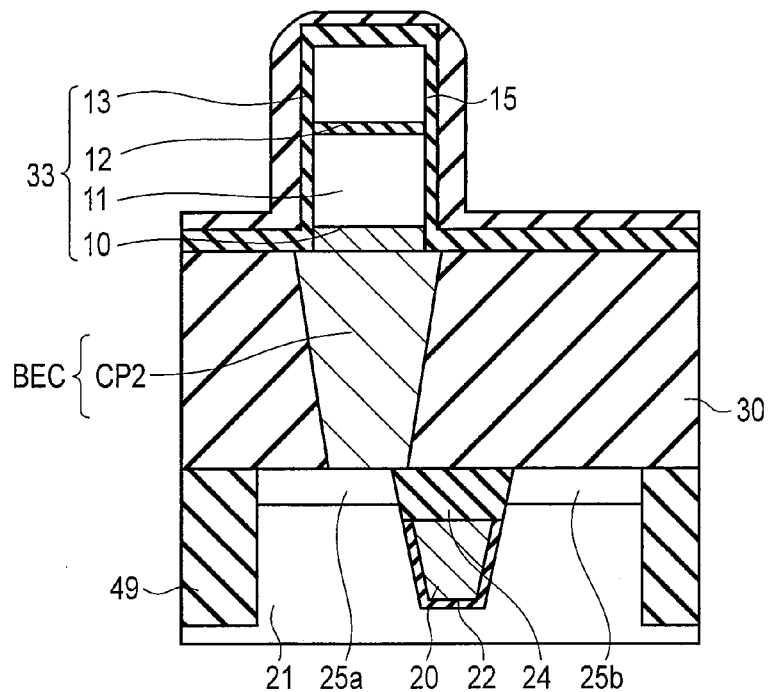
F I G. 10

NONVOLATILE SEMICONDUCTOR MEMORY DEVICE AND METHOD OF MANUFACTURING THE SAME

CROSS-REFERENCE TO RELATED APPLICATIONS

This application claims the benefit of U.S. Provisional Application No. 61/875,416, filed Sep. 9, 2013, the entire contents of which are incorporated herein by reference.

FIELD

Embodiments described herein relate generally to a nonvolatile semiconductor memory device and a method of manufacturing the same.

BACKGROUND

A spin transfer torque MRAM (Magnetic Random Access Memory) including a magnetoresistive element containing a ferromagnetic material as a memory element has been proposed (this memory will be called an MRAM hereinafter). This MRAM is a memory that stores information by controlling the electrical resistance of the magnetoresistive element in two states, i.e., a high-resistance state/low-resistance state by changing the magnetization direction in a magnetic layer by an electric current to be injected into the magnetoresistive element.

The magnetoresistive element includes a memory layer as a ferromagnetic layer having a variable magnetization direction, a reference layer as a ferromagnetic layer having an invariable magnetization direction, and a tunnel barrier layer as a nonmagnetic layer formed between them.

BRIEF DESCRIPTION OF THE DRAWINGS

FIG. 3 is a sectional view taken along a line 3-3' in FIG. 2;

FIG. 8 is a sectional view of an MRAM according to a modification of the first embodiment;

FIG. 9 is a sectional view showing the first manufacturing step of a magnetoresistive element according to the modification of the first embodiment; and FIG. 10 is a sectional view showing the second manufacturing step of the magnetoresistive element according to the modification of the first embodiment.

DETAILED DESCRIPTION

Figure 1:
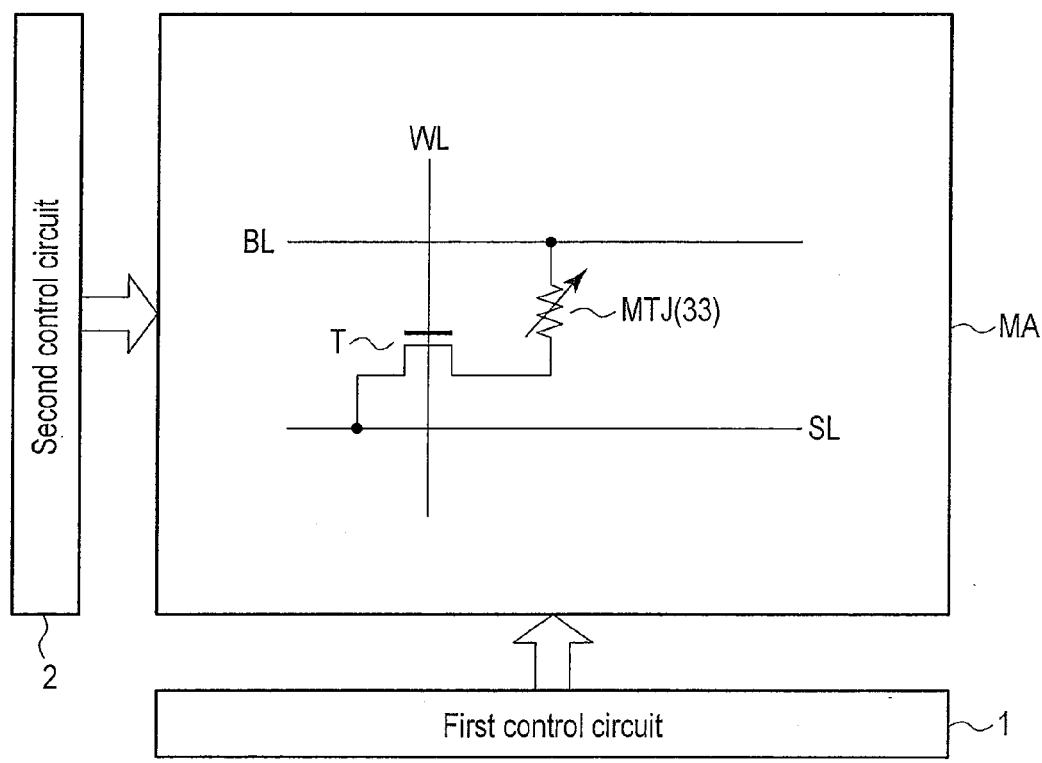
FIG. 1 is a circuit diagram showing a memory cell array of an MRAM according to the first embodiment.

In general, according to one embodiment, a nonvolatile semiconductor memory device includes a magnetoresistive element formed on a semiconductor substrate, a first contact plug which extends through an interlayer dielectric film formed on the semiconductor substrate and immediately below the magnetoresistive element, has a bottom surface in contact with an upper surface of the semiconductor substrate, and is adjacent to the magnetoresistive element, and an insulating film formed between the magnetoresistive element and the first contact plug and on the interlayer dielectric film, wherein the insulating film includes a first region positioned on a side of the interlayer dielectric film, and a second region positioned in the insulating film and on an upper surface of the first region, the insulating film is made of SiN, and the first region is a nitrogen-rich film compared to the insulating film in the second region.

This embodiment will be explained below with reference to the accompanying drawings. In this explanation, the same reference numerals denote the same arrangements throughout the drawings. However, it should be noted that the drawings are exemplary views, so the relationship between the thickness and the planar dimension, the ratio of the thicknesses of the respective layers, and the like are different from actual ones. Accordingly, practical thicknesses and dimensions should be judged by referring to the following explanation. Also, the individual drawings of course include portions having different dimensional relationships and different ratios.

First Embodiment

In the first embodiment, it is possible to deposit an insulating film that covers a magnetoresistive element and has a uniform thickness, and, by depositing this insulating film, suppress a leakage current generated between the magnetoresistive element and a contact plug CP connected to a source line.

1. <Overall Configuration Example of MRAM>

An overall configuration example of a nonvolatile semiconductor memory device according to this embodiment will be explained with reference to FIGS. 1, 2, and 3. The nonvolatile semiconductor memory device according to this embodiment includes an MRAM.

FIG. 1 is a circuit diagram showing a memory cell array of the MRAM according to this embodiment.

As shown in FIG. 1, a memory cell in a memory cell array MA includes a series circuit of a magnetoresistive element 33 and a switching element (e.g., an FET) T.

One terminal of the series circuit (one terminal of the magnetoresistive element 33) is electrically connected to a bit line BL, and the other terminal of the series circuit (one terminal of the switching element T) is electrically connected to a source line SL.

The control terminal of the switching element T, e.g., the gate electrode of the FET is electrically connected to a word line WL.

A first control circuit 1 controls the potential of the word line WL. A second control circuit 2 controls the potentials of the bit line BL and source line SL.

2. <Details of MRAM>

The structure of the MRAM will be explained in detail with reference to FIGS. 2 and 3.

Figure 2:
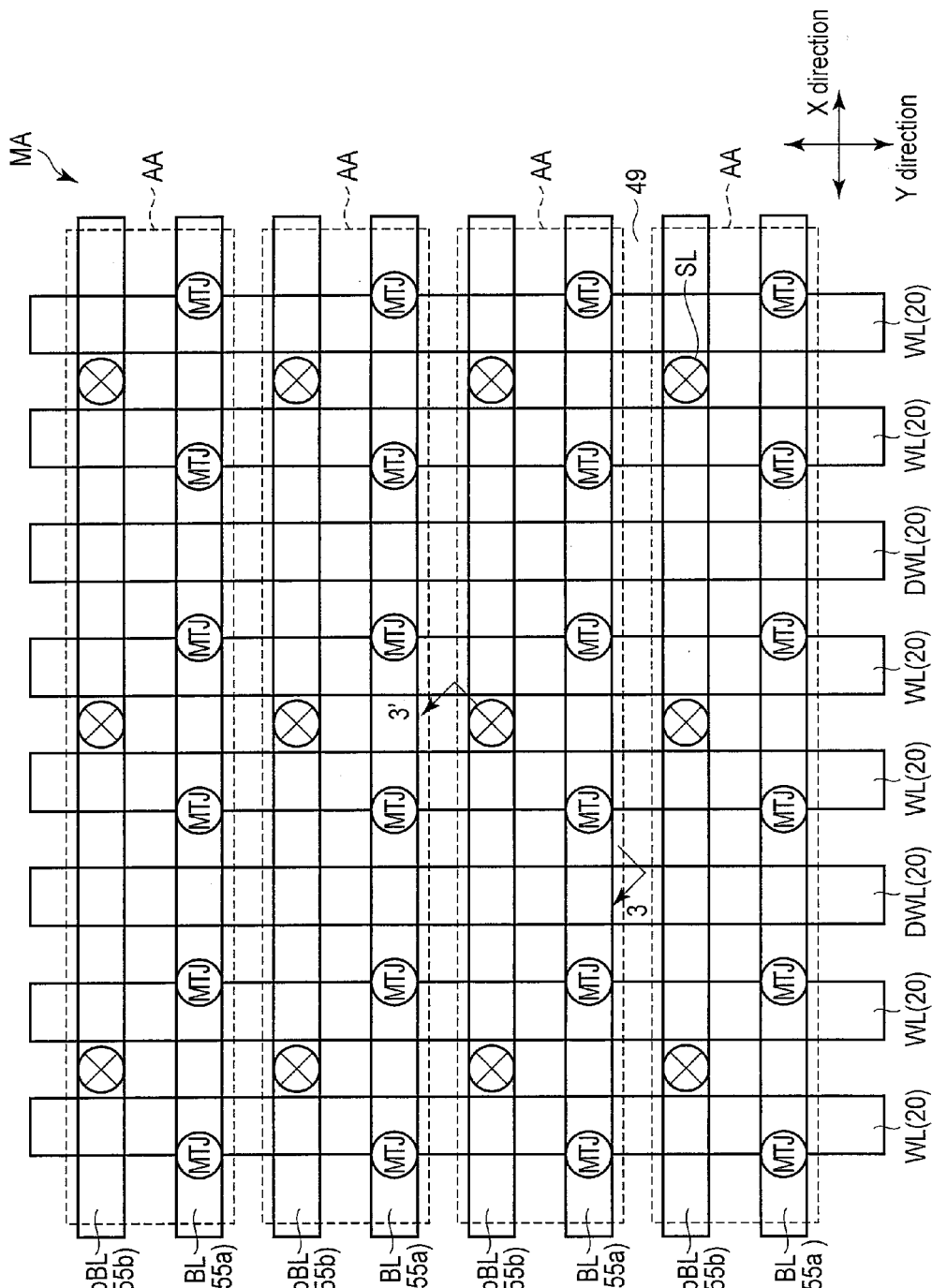
FIG. 2 is a plan view showing the memory cell array of the MRAM according to the first embodiment.

FIG. 2 is a plan view showing an arrayed arrangement (to be called a memory cell array hereinafter) of the MRAM according to this embodiment. FIG. 3 is a sectional view taken along a line 3-3' in FIG. 2. Note that FIG. 3 shows a section of a source line contact 35, in addition to a section of the magnetoresistive element 33.

As shown in FIGS. 2 and 3, the memory cell array MA includes, for example, a plurality of word lines WL and a plurality of dummy word lines DWL running in the Y direction, and a plurality of bit lines BL and a plurality of source lines SL running in the X direction. Note that the X direction is perpendicular to the Y direction.

Sets each including two word lines WL and one dummy word line DWL are alternately arranged along the X direction.

Also, the bit lines BL and source lines SL are arranged on an active area AA, and are alternately arranged along the Y direction.

An element isolation region 49 is buried between adjacent active areas AA. That is, the element isolation region 49 and active area AA are alternately formed along the Y direction.

The element isolation insulating layer 49 is formed by, e.g., STI (Shallow Trench Isolation). As the element isolation insulating layer 49, an insulating material having a high filling characteristic such as silicon nitride (SiN) is used.

The sectional view will now be explained.

In the memory cell array MA as shown in FIG. 3, an element isolation insulating layer is formed in the surface region of a p-type semiconductor substrate (e.g., a silicon substrate) 21, and this region functions as the element isolation region 49.

In the semiconductor substrate 21, a selection transistor T using, e.g., an n-channel MOSFET (Metal Oxide Semiconductor Field Effect Transistor) is formed as the switching element T. The selection transistor T has a structure obtained by forming a recess in the semiconductor substrate 21, and burying a gate electrode 20 containing, e.g., polysilicon in this recess.

More specifically, the selection transistor T includes a gate insulating layer 22, the gate electrode 20, and two diffusion layers 25a and 25b (a drain-side diffusion layer and source-side diffusion layer).

The gate insulating layer 22 is formed on the inner surface of the lower portion of the recess formed in the surface of the semiconductor substrate 21 and extending in the Y direction.

The gate electrode 20 is formed on the inner surface of the gate insulating layer 22 so as to fill the lower portion of the recess. The gate electrode 20 corresponds to the word line WL. An insulating layer 24 made of, e.g., SiN is formed on the upper surfaces of the gate insulating layer 22 and gate electrode 20 so as to fill the upper portion of the recess.

The upper surface of the insulating layer 24 has a height equal to that of the upper surface of the semiconductor substrate 21 (the upper surfaces of the diffusion layers 25a and 25b to be described below).

The two diffusion layers 25a and 25b are formed in the surface of the semiconductor substrate 21 so as to sandwich the gate insulating layer 22, gate electrode 20, and insulating layer 24.

Also, as shown in FIG. 3, the element isolation regions 49 are arranged on the two ends of the diffusion layers 25a and 25b.

Furthermore, an interlayer insulating layer 30 is formed on the semiconductor substrate 21 (on the insulating layer 24 and diffusion layers 25a and 25b).

A contact plug CP2 is formed in the interlayer dielectric layer 30 on the diffusion layer 25a. The contact plug CP2 will be called a BEC (Bottom Electronic Contact) hereinafter.

The BEC is formed in contact with a part of the upper surface of the diffusion layer 25a and a part of the upper surface of the insulating layer 24.

In other words, the BEC and diffusion layer 25a partially overlap each other in a plane. This is so because the processing methods of the BEC and the diffusion layer 25a (the recess) are different. The planar shape of the interlayer dielectric layer 30 is, e.g., a square. The BEC contains, e.g., TiN, but the material is not limited to this.

On the diffusion layer 25b, a contact plug CP1 having a bottom surface in contact with the diffusion layer 25b is formed to extend through the interlayer dielectric layer 30. The contact plug CP1 also extends through an interlayer dielectric layer 31 (to be described later), and has an upper surface in contact with a source line (55b (bBL) in FIG. 3).

In addition, the magnetoresistive element (to be referred to as an MTJ hereinafter) 33 electrically connected to the BEC is formed in the interlayer dielectric layer 31.

The MTJ is formed in contact with the upper surface of a lower electrode 10. The MTJ has, e.g., a circular planar shape, and is formed into a pillar shape. Note that in this embodiment, the planar area of the magnetoresistive element 33 and that of the lower electrode 10 have the same value. However, the planar area of the MTJ is desirably smaller than that of the lower electrode 10. This makes it possible to bring the entire lower surface of the MTJ into contact with the upper surface of the lower electrode 10, and reduce the contact resistance between them.

This MTJ includes a memory layer 11, a tunnel barrier layer 12, and a reference layer 13 in this order from below. That is, the memory layer 11 is formed on the lower electrode 10 formed on the upper surface of the BEC.

The memory layer 11 is a ferromagnetic layer in which the magnetization direction is variable, and has perpendicular magnetic anisotropy perpendicular to or almost perpendicular to the film surfaces (upper surface/lower surface). "The magnetization direction is variable" herein mentioned means that the magnetization direction changes with respect to a predetermined write current. Also, "almost perpendicular" means that the direction of the residual magnetization falls within the range of $45°<\theta\leq90°$ with respect to the film surfaces.

The tunnel barrier layer 12 is formed on the memory layer 11, and the reference layer 13 is formed on the tunnel barrier layer 12.

The tunnel barrier layer 12 is a nonmagnetic layer, and contains a nonmagnetic material such as MgO. However, the material is not limited to this, and the tunnel barrier layer 12 may also contain a metal oxide such as $Al_2O_3$, MgAlO, ZnO, or TiO.

The reference layer 13 is a ferromagnetic layer in which the magnetization direction is invariable, and has perpendicular magnetic anisotropy perpendicular to or almost perpendicular to the film surfaces. "The magnetization direction is invariable" herein mentioned means that the magnetization direction does not change with respect to a predetermined write current. That is, the magnetization-direction switching energy barrier of the reference layer 13 is larger than that of the memory layer 11.

Furthermore, a plurality of insulating films (to be also called a multilayered film hereinafter) are formed along the upper surface and sidewalls (side surfaces) of the MTJ, and along the surfaces (upper surfaces) of the BEC and interlayer dielectric layer 30. A practical arrangement of the insulating films will be described below with reference to an enlarged view in FIG. 3. This enlarged view is a sectional view in the direction of 3-3', and shows the periphery of the MTJ in an enlarged scale.

<Insulating Film 14>

An insulating film 14 is formed along the sidewalls of the lower electrode 10, memory layer 11, tunnel barrier layer 12, and reference layer 13. The insulating film 14 is made of silicon-rich SiN. More specifically, x and y in $Si_xN_y$ are set such that the ratio of silicon to nitrogen is higher than or close to a reference composition ratio. Practical values of x and y are x=1 and y=1.1.

Also, the thickness of the insulating film 14 is about 1 to 2 nm.

<Insulating Film 15>

In addition, an insulating film 15 is formed along the sidewalls of an upper electrode 17 (to be described later) and the insulating film 14, and along the BEC and interlayer dielectric layer 30.

The insulating film 15 is made of nitrogen-rich SiN. That is, when the reference ratio of x to y in $Si_x N_y$ is 3:4, the ratio of nitrogen to silicon is sometimes close to this reference ratio, and sometimes higher than the reference composition ratio.

The insulating film 15 is made of a low-conductivity material. That is, the insulating film 15 having a low conductivity can be formed by using nitrogen-rich SiN.

Furthermore, the thickness of the insulating film 15 on the sidewall differs from that of the insulating film 15 on the bottom surface and upper surface. More specifically, the thickness is about 1 to 2 nm on the sidewall. When formed along the interlayer dielectric layer 30 and BEC, the thickness of the insulating film 15 is about 3 to 4 nm.

Also, the composition ratio of nitrogen in the SiN film changes in accordance with this thickness difference. More specifically, the ratio of x to y on the upper surface and bottom surface is x=1 to y=1.5, and the ratio of x to y on the sidewall is x=1 to y=1.3.

As will be described later, this nitrogen-rich SiN can be obtained by performing plasma nitridation on silicon-rich SiN.

In addition, as shown in FIG. 3, the upper surface of the insulating film 15 formed on the sidewall of the MTJ is higher than the upper surface of the reference layer 13. However, the arrangement is not limited to this.

For example, the upper surface of the insulating film 15 formed on the sidewall of the MTJ and the upper surface of the reference layer 13 may also be leveled with each other. Note that the upper surface of the insulating film 15 is sometimes higher than that of the reference layer 13 because the reference layer 13 is also etched when an insulating film 16 and the insulating film 15 are etched by RIE in Step. 5 (to be described later).

<Insulating Film 16>

Furthermore, an insulating layer 16 is formed to cover the whole MTJ, i.e., along the sidewalls of an upper electrode 17 and the insulating layer 15.

Like the above-mentioned insulating layer 14, the insulating layer 16 is made of silicon-rich SiN. That is, the composition ratio of x to y can also be the same as that in the insulating layer 14.

Also, the thickness of the insulating film 16 on the sidewall of the MTJ differs from that of the insulating film 16 on the bottom surface and upper surface of the MTJ. More specifically, the thickness is about 12 nm on the sidewall. When formed along the interlayer dielectric layer 30 and BEC, the thickness of the insulating film 16 is about 16 to 17 nm.

In FIG. 3, therefore, the value of tsw1 is about 20 nm, and the value of tsw2 is about 14 nm.

In the interlayer dielectric layer 31 as described above, the nitrogen-rich insulating film 15 and silicon-rich insulating film 16 are sequentially stacked on the interlayer dielectric layer 30 with respect to the semiconductor substrate 21.

Note that the multilayered film including the insulating films 15 and 16 need not clearly be separated. For example, in the multilayered film, a first region in which the content of nitrogen is higher than that of silicon may exist on the side of the semiconductor substrate 21, and a second region in which the content of silicon is higher than that of nitrogen may exist on the side of the interlayer dielectric layer 31.

That is, a region where the composition ratio of nitrogen is higher than that of silicon need only exist at least along a path in which the MTJ and contact plug CP1 are electrically connected.

The explanation of the arrangement shown in FIG. 3 will be continued.

An upper electrode 17 is formed on the upper surface of the reference layer 13, and a contact plug CP3 (Top Electronic Contact, to be called a TEC hereinafter) having a bottom surface in contact with the upper surface of the upper electrode 17 and an upper surface in contact with the bit line BL is formed.

As described above, the contact plug CP1 extends through the interlayer dielectric layers 30 and 31 and insulating films 15 and 16, and has a bottom surface in contact with the upper surface of the diffusion layer 25b. The upper surface of the contact plug CP1 is connected to the source line (55b (bBL) in FIG. 3).

Note that of three gate electrodes 20 adjacent to each other in the X direction as shown in FIG. 2, two gate electrodes 20 are electrically connected to the magnetoresistive elements 33 and function as the word lines WL, and one gate electrode 20 is not electrically connected to the magnetoresistive element 33 and functions as the dummy word line DWL.

2. <Manufacturing Steps>

The manufacturing steps of the MRAM according to the first embodiment will be explained below with reference to FIGS. 4, 5, 6, and 7. In the following manufacturing steps, the insulating films 14 to 16 formed to cover the MTJ will be noted.

2.1<FIG. 4>

Step. 1

First, layers are formed up to a BEC buried in an interlayer dielectric layer 30 by using the well-known techniques.

After that, a metal layer 10, magnetic layer 11, insulating layer 12, and reference layer 13 are sequentially stacked on the interlayer dielectric layer 30 and BEC, and a resist film formed after that is partially left behind.

Figure 4:
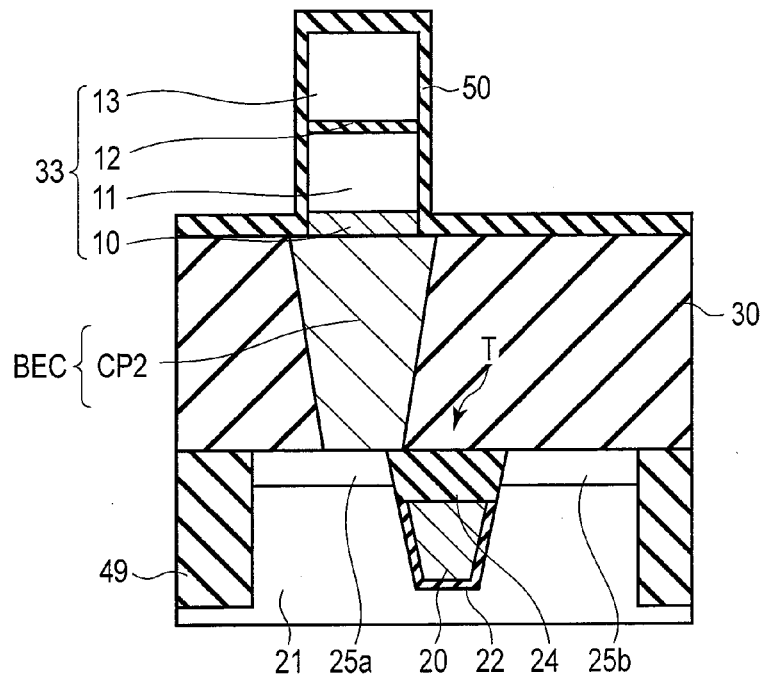
FIG. 4 is a sectional view showing the first manufacturing step of a magnetoresistive element according to the first embodiment.
Figure 5:
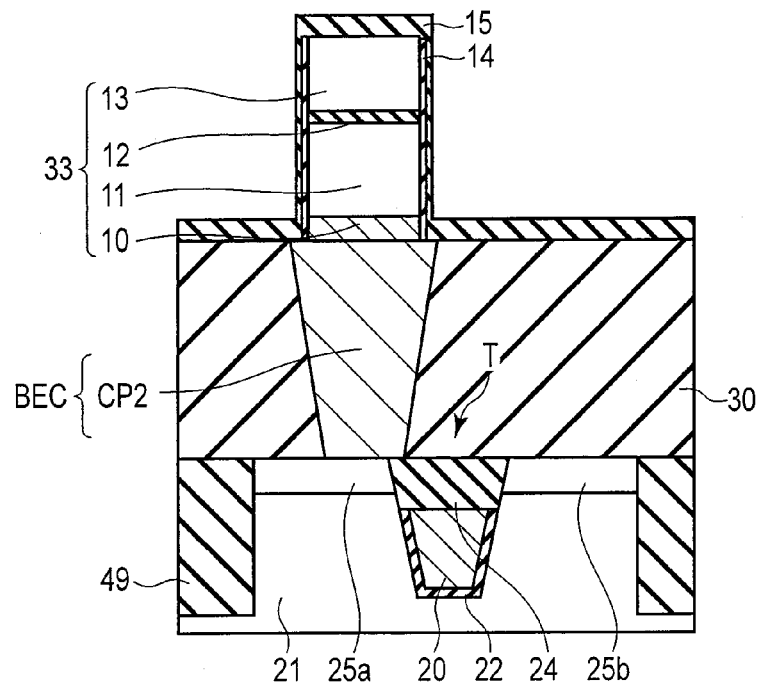
FIG. 5 is a sectional view showing the second manufacturing step of the magnetoresistive element according to the first embodiment.
Figure 6:
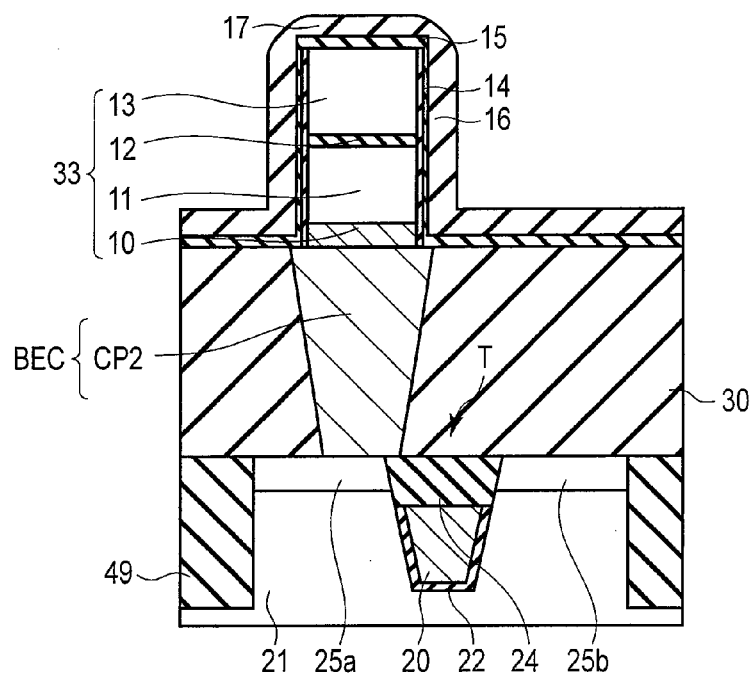
FIG. 6 is a sectional view showing the third manufacturing step of the magnetoresistive element according to the first embodiment.

Then, the reference layer 13, insulating layer 12, magnetic layer 11, and metal layer 10 are etched by using the resist film as a mask, thereby forming a gate structure shown in FIG. 4. In this step, the corners of the reference layer 13 of the gate structure are rounded.

Step. 2

Subsequently, while the ambient temperature is set at about 300° C., an SiN film 50 is formed to cover the upper surfaces of the interlayer dielectric layer 30 and BEC and the upper surface and sidewalls of the gate structure by using TSA (Trisilylamine) in RLSA plasma CVD.

Consequently, a silicon-rich SiN film 50 having a uniform thickness is formed to cover the interlayer dielectric layer 30, BEC, and gate structure.

Note that the ambient temperature is set at about 300° C. because if the SiN film 50 is formed at a temperature higher than 300° C., the metal layer 10, magnetic layer 11, and the like may be damaged.

In this embodiment as shown in FIG. 4, the SiN film 50 has a thickness equal to a height "h1" on the upper surface of the gate structure and on the interlayer dielectric layer 30 and EEC, and a thickness equal to a width "w1" on the sidewalls of the gate structure.

Although the values of "h1" and "w1" are different, the SiN film 50 is a flat film on the sidewalls, upper surface, and bottom surface, i.e., the SiN film 50 is an unbiased film on the film growth surfaces with respect to the structure. This is so because the SiN film is deposited at a low temperature of 300° C.

2.2<FIG. 5>

Step. 3

After that, the SiN film 50 as an insulating film 50 is changed (modified) into a nitrogen-rich SiN film 15 by a plasma nitriding process. That is, in the composition ratio of x to y described above, the ratio of nitrogen increases compared to silicon. More specifically, the ratio of nitrogen rises to approximately 3:4, or SiN is made of nitrogen more than this reference value, as described previously.

In this step, the sidewalls are not entirely nitrided, and the silicon-rich SiN film remains. This film is the insulating film 14 described above.

Note that in this plasma nitriding process, the height "h" becomes about 3 to 4 nm, and the width "w" becomes about 1 to 2 nm. As described previously, the ratio of nitrogen to silicon in the insulating layer 15 formed on the side surfaces of the gate structure is lower than that of the insulating film 15 formed on the upper surface of the gate structure and on the BEC and interlayer dielectric layer 30.

2.3<FIG. 6>

Step. 4

In addition, an insulating film 16 is deposited to cover the insulating film 15 by RSLA plasma CVD. Like the insulating film 14, the insulating film 16 is a silicon-rich SiN film.

2.4<FIG. 7>

Step. 5

Then, the insulating films 15 and 16 as prospective formation regions of an upper electrode 17 are etched by RIE, and a metal film (that becomes an upper electrode 17 later) is buried. An upper electrode 17 is formed by polishing this metal film by CMP.

Furthermore, after an interlayer dielectric layer 31 shown in FIG. 3 is stacked, a through hole extending through the interlayer dielectric layer 31, insulating film 16, insulating film 15, and interlayer dielectric layer 30 and reaching the diffusion layer 25b, and a prospective TEC formation region are formed by, e.g., RIE.

After that, a contact plug CP1 and TEC are formed by burying metal layers in the through hole and prospective TEC region. As a consequence, the structure shown in FIG. 3 can be obtained.

Figure 7:
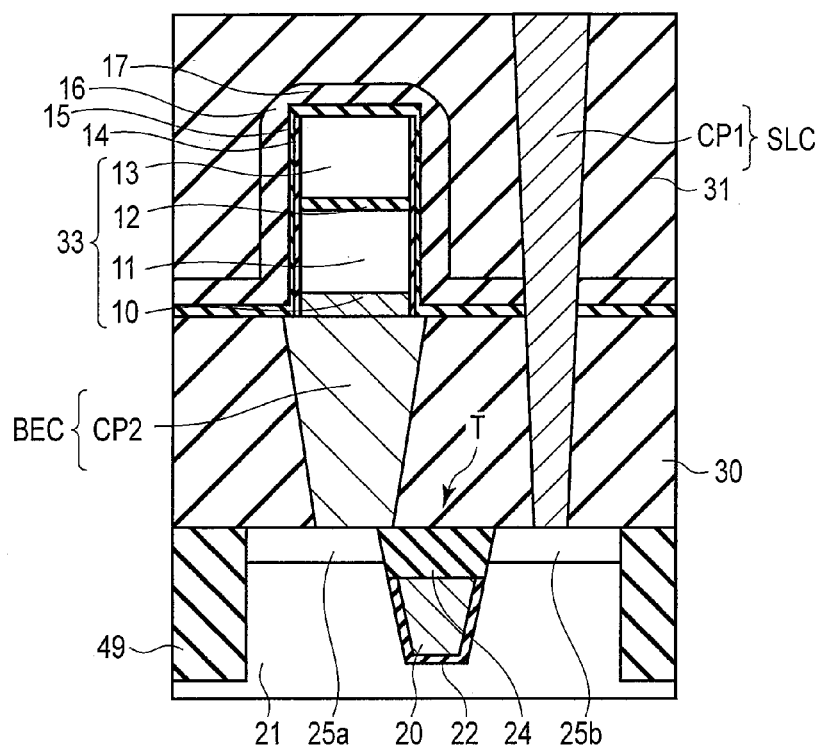
FIG. 7 is a sectional view showing the fourth manufacturing step of the magnetoresistive element according to the first embodiment.

As shown in FIG. 7, a distance "l" between the contact plug CP1 and MTJ is about 8 to 10 nm.

The distance "l" is smaller than the distance between this MTJ and an adjacent MTJ (not shown).

<Effects of First Embodiment>

The MRAM according to the first embodiment can achieve effects (1) to (4) below.

(1) The insulating film 15 having a uniform thickness can be deposited.

This will be explained by taking a comparative example in order to facilitate understanding. This comparative example is a structure in which a nitrogen-rich insulating film 15 having a large thickness covering the gate structure is deposited in one step instead of Steps. 1 to 3 described above. Note that the same reference numerals denote the same structures.

The characteristic of the nitrogen-rich insulating film 15 has the problem that a uniform thickness is difficult to obtain on, e.g., the upper surface and sidewalls of the gate structure. For example, the insulating film 15 is difficult to deposit on a corner formed by the side surface of the metal layer 10 and the upper surface of the BEC, and a domed insulating film 15 like a swelled film is deposited on the interlayer dielectric layer 30 and on the upper surface of the gate structure.

By contrast, the insulating film 15 having a uniform thickness can be deposited in the MRAM according to the first embodiment.

This is so because the embodiment uses the characteristic that a silicon-rich SiN film has a uniform thickness as described above. Accordingly, a silicon-rich SiN film need only be deposited as the insulating film 15, but this film allows an easy flow of an electric current (has conductivity). This characteristic poses a problem to be explained in effect (2) below.

In the first embodiment, therefore, a film having a uniform thickness is first formed by depositing the silicon-rich SiN film 50, and then a plasma nitriding process is performed. This makes it possible to deposit the nitrogen-rich insulating film 15 having a uniform thickness, although the values of "h" and "w" are different.

(2) A leakage current flowing between the MTJ and contact plug PC1 can be reduced.

This feature will also be explained by taking a comparative example in order to facilitate understanding.

This comparative example is a structure in which a single-layered, silicon-rich SiN film is deposited on the upper surface and sidewalls of the gate structure, on the BEC, and on the interlayer dielectric layer 30 as described above.

As described previously, the deposited insulating film has a uniform thickness.

However, the distance "l" between the MTJ and contact plug CP1 is as short as about 8 to 10 nm, and a silicon-rich SiN film has conductivity as described above.

In the structure of the comparative example, therefore, when executing, e.g., a data read or write operation, a potential difference is produced between the MTJ and contact plug CP1, so an electric current flowing through the MTJ flows into the contact plug CP1 through the path between the interlayer dielectric layer 30 and silicon-rich SiN film. This causes an operation error of the nonvolatile semiconductor memory device.

By contrast, in the nonvolatile semiconductor memory device according to the first embodiment, the insulating film 15 is formed between the MTJ and contact plug CP1 as shown in FIGS. 3 and 7.

The insulating film 15 has a low conductivity as described previously, and hence can suppress a leakage current such as that generated in the comparative example. More specifically, the current value can be reduced by about two orders of magnitude from that in the structure of the comparative example. That is, it is possible to prevent an operation error of the nonvolatile semiconductor memory device, and improve the reliability of the device.

(3) Deterioration of the MTJ can be prevented.

In the nonvolatile semiconductor memory device according to the first embodiment, the value of the thickness "w" of the nitrogen-rich SiN film on the sidewalls is smaller than that of the thickness "h" of the nitrogen-rich SiN film formed on, e.g., the upper surface of the MTJ as mentioned earlier. However, this thickness difference can achieve the effect of preventing deterioration of the MTJ during the nitriding process.

The reasons for this are:

(i) Since the nitriding process has a high energy, the MTJ readily deteriorates if the nitriding process is performed on the sidewalls of the MTJ for a long time period.

(ii) Although the suppression of the leakage current is explained in above-mentioned effect (2), the insulating film 15 can be deposited at least on the interlayer dielectric layer 30 and between the MTJ and contact plug CP1 where a leakage current is readily generated.

For reasons (i) and (ii) above, deterioration of the MTJ can be prevented more when the value of the thickness "w" of the insulating film 15 formed on the sidewalls is smaller than that of "h".

(4) The parasitic capacitance can be reduced.

In the nonvolatile semiconductor memory device according to the first embodiment, the parasitic capacitance between adjacent MTJs can be reduced.

The dielectric constant of a nitrogen-rich SiN film is higher than that of a silicon-rich SiN film. That is, if the thickness "w" on the sidewalls of adjacent MTJs is large, the parasitic capacitance increases between these adjacent MTJs. This may change data held in these MTJs.

By contrast, in the nonvolatile semiconductor memory device according to the first embodiment, the parasitic capacitance between adjacent MTJs can be reduced because the thickness "w" on the sidewalls is small.

Note that the same effect can be achieved for the parasitic capacitance between the MTJ and contact plug CP1.

<Modification>

Next, a nonvolatile semiconductor memory device according to a modification of the first embodiment will be explained with reference to FIGS. 8, 9, and 10.

This modification is a structure in which the insulating film 14 is excluded from the above-mentioned first embodiment. Only an arrangement different from the first embodiment will be explained below.

1. <Details of MRAM>

FIG. 8 shows the section of a memory cell array according to the modification. FIG. 8 is a sectional view taken along a line 3-3' in FIG. 2.

As shown in FIG. 8, an insulating film 15 is directly formed along an upper electrode 17, reference layer 13, tunnel barrier layer 12, memory layer 11, lower electrode 10, BEC, and interlayer dielectric layer 30.

The insulating layer 15 has a thickness of about 1 to 2 nm on the sidewalls, and a thickness of about 3 to 4 nm on the BEC and interlayer dielectric layer 30.

In addition, an insulating film 16 is formed to cover the insulating film 15.

2. <Manufacturing Steps>

Manufacturing steps according to the modification will now be explained with reference to FIGS. 9 and 10. Note that an explanation of the same steps as those of the nonvolatile semiconductor memory device according to the first embodiment will be omitted.

2.1 <FIG. 9>

Step. 11

First, as shown in FIG. 9, an insulating film 15 made of nitrogen-rich SiN is deposited along an upper electrode 17, reference layer 13, tunnel barrier layer 12, memory layer 11, lower electrode 10, BEC, and interlayer dielectric layer 30 by using RSLA plasma CVD.

Note that the insulating film 15 is deposited in one step in the nonvolatile semiconductor memory device according to the modification, but the film thickness differs from the thickness of the insulating film 15 of the comparative example described in effect (1) of the first embodiment. That is, since the insulating film 15 of the modification has a thickness equivalent to that of the first embodiment, so the problem explained in the comparative example of effect (1) does not occur in this modification.

2.2 <FIG. 10>

Step. 12

After that, an insulating film 16 is deposited as shown in FIG. 10, and the structure shown in FIG. 8 is obtained through the step explained with reference to FIG. 7.

<Effects of Modification>

Even the nonvolatile semiconductor memory device according to this modification can achieve effects (1) to (4) of the above-mentioned first embodiment, and can also achieve effect (5) below.

(5) The number of manufacturing steps can be reduced.

When manufacturing the nonvolatile semiconductor memory device according to the modification, Steps. 2 and 3 described previously can be omitted. That is, it is possible to reduce the manufacturing cost while obtaining effects (1) to (4).

Note that as explained in the first embodiment and its modification, it is desirable to uniformly deposit the insulating film 15 on the entire surface of the MTJ in order to suppress the leakage current between the MTJ and contact plug CP1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a magnetoresistive element formed on a semiconductor substrate;
    a first contact plug which extends through an interlayer dielectric film formed on the semiconductor substrate and immediately below the magnetoresistive element, has a bottom surface in contact with an upper surface of the semiconductor substrate, and is adjacent to the magnetoresistive element; and
    an insulating film formed between the magnetoresistive element and the first contact plug and on the interlayer dielectric film,
    wherein the insulating film includes a first region positioned on a side of the interlayer dielectric film, and a second region positioned in the insulating film and on an upper surface of the first region,
    the insulating film is made of SiN, and
    the first region is a nitrogen-rich film compared to the second region.

2. The device according to claim 1, wherein
    the insulating film is further formed along an upper surface and sidewall of the magnetoresistive element, and
    a thickness of the insulating film formed on the upper surface is larger than that of the insulating film formed on the sidewall.

3. The device according to claim 1, wherein
    the insulating film is a multilayered film,
    the multilayered film includes a first insulating film and a second insulating film formed on the first insulating film,
    the first insulating film is formed in the first region, and
    the second insulating film is formed in the second region.

4. The device according to claim 1, wherein
the insulating film is further formed along an upper surface and sidewall of the magnetoresistive element,
the insulating film formed on the sidewall includes a third region having the same conductivity as that of the second region, the first region, and the second region, in an order named from the magnetoresistive element toward an outside,
the first region is a nitrogen-rich film compared to the second region and the third region.

5. The device according to claim 4, wherein
the insulating film is a multilayered film,
the multilayered film includes a first insulating film, a second insulating film formed on the first insulating film, and a third insulating film formed below the first insulating film,
the first insulating film is formed in the first region,
the second insulating film is formed in the second region, and
the third insulating film is formed in the third region.

6. The device according to claim 3, wherein the first insulating film has a thickness of 3 to 4 nm.

7. The device according to claim 5, wherein the third insulating film has a thickness of 1 to 2 nm.

8. The device according to claim 6, wherein the first insulating film is obtained by performing a plasma nitriding process after a silicon-rich SiN film is deposited.

9. The device according to claim 5, wherein the first insulating film formed on the sidewall has a dielectric constant higher than those of the second insulating film and the third insulating film.

* * * * *